(12) United States Patent
Singh et al.

(10) Patent No.: US 11,180,398 B2
(45) Date of Patent: Nov. 23, 2021

(54) DEIONIZED-WATER COOLING FOR ELECTRICAL EQUIPMENT

(71) Applicant: International Business Machines Corporation, Armonk, NY (US)

(72) Inventors: Prabjit Singh, Poughkeepsie, NY (US); Lawrence Palmer, Hyde Park, NY (US); Levi Campbell, Poughkeepsie, NY (US); Charles Leon Arvin, Poughkeepsie, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 98 days.

(21) Appl. No.: 16/436,953

(22) Filed: Jun. 11, 2019

(65) Prior Publication Data

US 2020/0392026 A1 Dec. 17, 2020

(51) Int. Cl.
*C02F 9/00* (2006.01)
*C02F 1/42* (2006.01)
(Continued)

(52) U.S. Cl.
CPC ........... *C02F 9/00* (2013.01); *H05K 7/20272* (2013.01); *H05K 7/20781* (2013.01);
(Continued)

(58) Field of Classification Search
CPC .... C02F 9/00; C02F 1/001; C02F 1/20; C02F 1/325; C02F 1/42; C02F 1/50;
(Continued)

(56) References Cited

U.S. PATENT DOCUMENTS 4,259,269 A * 3/1981 Flowers ................. B01F 13/10
210/167.3
4,595,498 A * 6/1986 Cohen .................. B01D 61/145
210/192
(Continued)

FOREIGN PATENT DOCUMENTS

CN 2014151158 U 2/2015
CN 106219904 A 12/2016
(Continued)

OTHER PUBLICATIONS

Kiranmayi et al., "Synthesis, characterization and antibacterial activity of aluminum oxide nanoparticles," 2018, International Journal of Pharmacy and Pharmaceutical Sciences, vol. 10, Issue 1, p. 32-35 (Year: 2018).*
(Continued)

*Primary Examiner* — Hayden Brewster
(74) *Attorney, Agent, or Firm* — Cantor Colburn LLP; Tihon Poltavets

(57) ABSTRACT

A deionized-water cooling system for electrical equipment is provided. The system includes a cooling loop in which water comes into contact with the electrical equipment and a deionization bypass connected to the cooling loop. The deionization bypass includes a first filter component configured to remove dissolved oxygen, a second filter component configured to filter solid particles, a deionization cartridge configured to deionize water, and a plurality of valves configured to control a water flow within the deionization bypass.

5 Claims, 6 Drawing Sheets

(51) Int. Cl.
  C02F 1/50 (2006.01)
  C02F 103/02 (2006.01)
  H05K 7/20 (2006.01)
  *C02F 1/00* (2006.01)
  *C02F 1/32* (2006.01)
  *C02F 1/70* (2006.01)
  *C02F 1/20* (2006.01)
  *C02F 101/10* (2006.01)

(52) U.S. Cl.
  CPC .............. *C02F 1/001* (2013.01); *C02F 1/20* (2013.01); *C02F 1/325* (2013.01); *C02F 1/42* (2013.01); *C02F 1/50* (2013.01); *C02F 1/705* (2013.01); *C02F 2101/10* (2013.01); *C02F 2103/023* (2013.01); *C02F 2301/043* (2013.01); *C02F 2303/04* (2013.01)

(58) Field of Classification Search
  CPC .............. C02F 1/705; C02F 2101/10; C02F 2103/023; C02F 2301/043; C02F 2303/04; H05K 7/20272; H05K 7/20781
  See application file for complete search history.

(56) References Cited

U.S. PATENT DOCUMENTS

2015/0343372 A1    12/2015   Marei et al.
2017/0313611 A1*   11/2017   Huynh .................. C02F 9/005

FOREIGN PATENT DOCUMENTS

WO          9831636          7/1998
WO    WO-2006026815 A1 *    3/2006   ............ A01N 59/16

OTHER PUBLICATIONS

Pan et al. (Cooling water use in thermoelectric power generation and its associated challenges for addressing water-energy nexus, Water-Energy Nexus, vol. 1, 1, Apr. 11, 2018, pp. 26-41).*

Lee et al. (Recent transitions in ultrapure water (UPW) technology: Rising role of reverse osmosis (RO), Desalination, vol. 399, 1, Sep. 16, 2016, pp. 185-197).*

* cited by examiner

DEIONIZED-WATER COOLING FOR ELECTRICAL EQUIPMENT

BACKGROUND

The present invention generally relates to cooling of electrical equipment. More specifically, the present invention relates to a deionized-water system for cooling electrical equipment.

Generally, electrical equipment generates heat during the course of its operation. Hence, continuous cooling of the electrical equipment is required to maintain proper operational conditions. Known cooling processes consist of using deionized, cooled water circulating through cooling loops within the electrical equipment to be cooled. The circulation of the water is ensured using pumps. In order to maintain the deionized-water purity, a deionization cartridge can be included.

Deionized-water cooling systems are important to the reliable operation of many types of electrical equipment. When properly designed and maintained, these systems can provide reliable cooling and leak-free operation for many years.

SUMMARY

According to one or more embodiments of the present invention, a deionized (DI)-water cooling system for electrical equipment is provided. The system includes a cooling loop in which water comes into contact with the electrical equipment and a deionization bypass connected to the cooling loop. The deionization bypass includes a first filter component configured to remove dissolved oxygen, a second filter component configure to filter solid particles, a deionization cartridge configured to deionize water; and a plurality of valves configured to control a water flow within the deionization bypass.

According to another embodiment of the present invention, a deionized (DI)-water cooling system for electrical equipment is provided. The system includes a cooling loop in which water comes into contact with the electrical equipment and a deionization bypass connected to the cooling loop. The deionization bypass includes a first filter component configured to remove dissolved oxygen, a deionization cartridge configured to deionize water; an injection pump configured to introduce metal particles to the deionization bypass, and a plurality of valves configured to control a water flow within the deionization bypass.

In yet another embodiment of the present invention, a method for deionized (DI)-water cooling of electrical equipment is provided. The method includes pumping water from a facility water system to a DI-water cooling system. The DI-water cooling system includes a cooling loop in which water comes into contact with the electrical equipment and a deionization bypass connected to the cooling loop. The method further includes removing dissolved oxygen and acid from the water in the deionization bypass by using a first filter component and deionizing the water in the deionization bypass by using a deionization cartridge, and directing the water to the cooling loop.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

Figure 1:
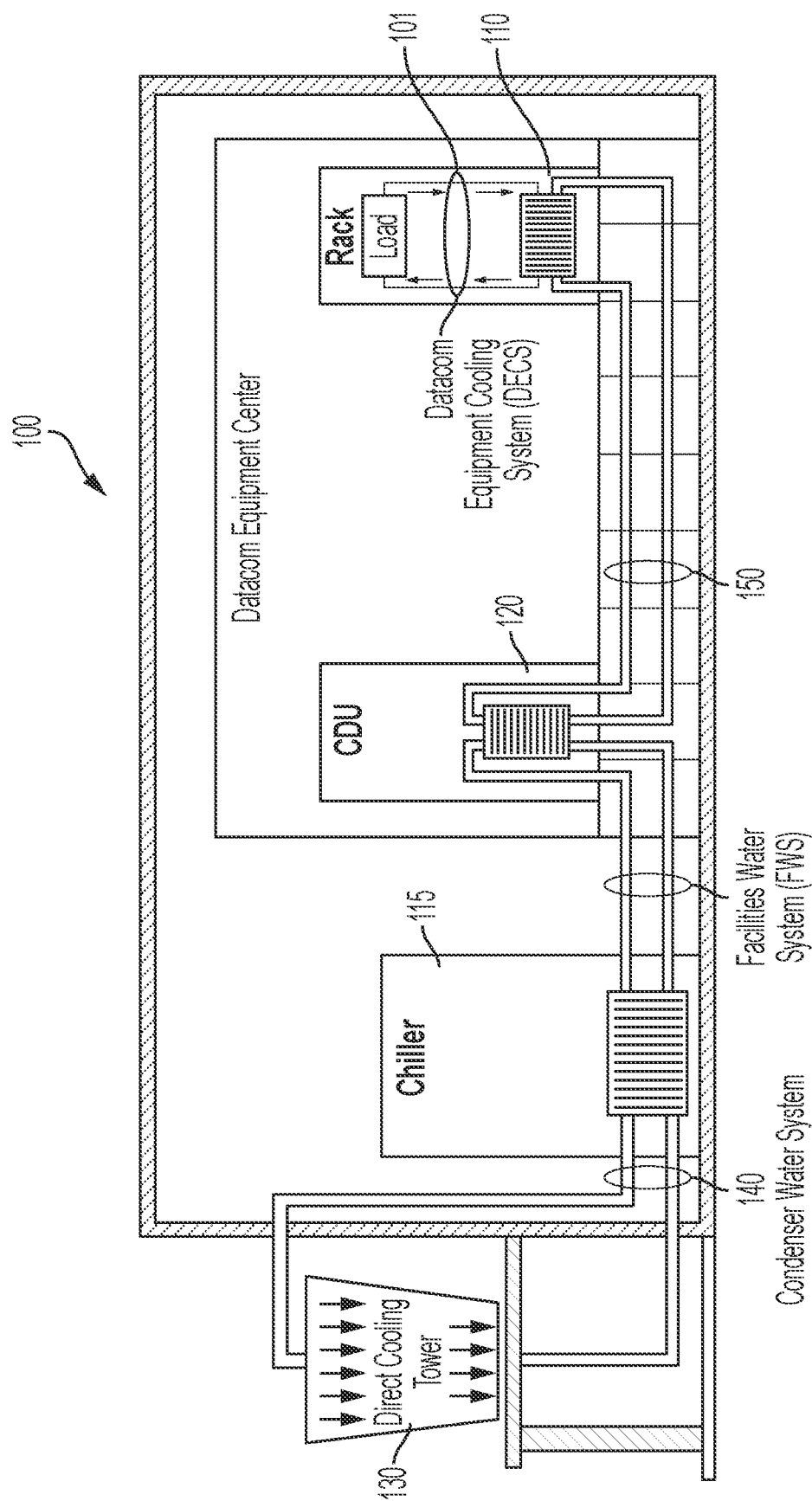
FIG. 1 depicts a liquid cooling system for electrical equipment according to embodiments of the present invention.

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the disclosed embodiments, the various elements illustrated in the figures are provided with two or three-digit reference numbers. With minor exceptions, the leftmost digit(s) of each reference number correspond to the figure in which its element is first illustrated.

DETAILED DESCRIPTION

For the sake of brevity, conventional techniques related to making and using aspects of the invention may or may not be described in detail herein. In particular, various aspects of computing systems and specific computer programs to implement the various technical features described herein are well known. Accordingly, in the interest of brevity, many conventional implementation details are only mentioned briefly herein or are omitted entirely without providing the well-known system and/or process details.

Electrical equipment, such as, for example, datacom equipment, generates heat during the course of its operation. Hence, continuous cooling of the equipment is required to maintain proper operational conditions of the equipment. Generally, a datacom equipment cooling system (DECS) is a water loop in which the water comes in contact with the components to be cooled. There are cases where the DECS water is supplied by an in-rack cooling distribution unit (CDU) or it can be supplied by an external CDU that services multiple equipment racks. The water quality standards that are specified pertain only to the DECS water loop that comes into contact with computer components. The cooling loop hardware consists mainly of corrosion resistant alloys, such as copper alloys and stainless steels. The water treatment depends on the type of the equipment, DECS and the local municipality water quality. Proper treatment of the water is necessary to avoid common water-related problems, such as corrosion, microbiological growth, scale formation, and fouling. Any of these problems can significantly reduce the cooling efficiencies and increase the risk of system downtime.

A known cooling system uses deionized (DI), cooled water circulating through cooling loops within the electrical equipment. The water can be deionized before the equipment is connected to the water loop of the cooling system. DI water is the water that has been purified and neutralized, including removing positively charged ions (cations), like calcium and magnesium, or negatively charged ions (anions), such as chloride and sulfate. Accordingly, DI water is substantially free from any charged particles, giving DI water a neutral pH, high resistivity and essentially no dissolved solids.

DI water has chemical and electrical properties that make it the optimal choice for cooling when the liquid circuit contains micro-channels or when sensitive electronics are involved. DI water has an extremely low concentration of ions which imparts important performance attributes. Firstly, DI water eliminates mineral deposits which block the coolant flow. Mineral deposits degrade cooling efficiency and system operating performance. Secondly, DI water eliminates the risk of electrical arcing due to static charge build up from the circulating coolant. The arcing can damage sensitive control electronics in the equipment being cooled. The lack of ions in DI water eliminates both of these problems.

The absence of ions in DI water, however, makes DI water extremely corrosive. For example, copper (Cu) is known to be susceptible to the corrosion caused by DI water. When DI water's pH falls below 6.5, copper molecules can "leach" into a DI water stream. Stainless steel is the most common option for use in cooling systems due to stainless steel' anticorrosive properties. However, at elevated levels of purity, stainless steel may also "leach" over time and can corrode in case when DI water's pH becomes acidic or alkaline.

More specifically, dissolved oxygen that remains in DI water (while carbon dioxide is removed) after de-ionization process reacts with components of the cooling system, for example, copper or stainless steel components. The specific amounts of dissolved oxygen depend on various factors, for example, DI water temperature and pH. However, generally, in the presence of dissolved oxygen and acid, DI water can react, for example, with copper as follows:

$$O_2 + 4H^+ + 4e^- \rightarrow 4H_2O; E^0 = +1.229V$$

$$(Cu \rightarrow Cu^{2+} + 2e^-)*2; E^0 = -0.34V$$

$$2Cu + O_2 + 4H^+ = 2Cu^{2+} + 4H_2O; E^0 = +1.229V + -0.34V = +0.889V$$

In the presence of dissolved oxygen only, DI water can react with copper as follows:

$$O_2 + 2H_2O + 4e^- \rightarrow 4OH^-; E^0 = +0.401V$$

$$(Cu \rightarrow Cu^{2+} + 2e^-)*2; E^0 = -0.34V$$

$$2Cu + O_2 + 2H_2O = 2Cu^{2+} + 4OH^-; E^0 = +0.40 + -0.34V = +0.06V$$

Metal oxides can have the following reactions in DI water:

$$CuO + 2H^+ \rightarrow Cu^{2+} + H_2O$$

$$SnO + 2H^+ \rightarrow Sn^{2+} + H_2O$$

$$Ag_2O + 2H^+ \rightarrow 2Ag^+ + H_2O$$

Further, dissolved oxygen in DI water can result in microbiological fouling in a cooling system. Even small amounts of oxygen can support microbial and fungal growth. Once-through cooling streams generally contain relatively low levels or none of the nutrients essential for microbial growth, however, recirculating systems can introduce microbes from the air and through evaporation. As a result, microbe growth can become more rapid. Process leaks may also contribute further to the nutrient load of the cooling water. In addition to the availability of organic and inorganic nutrients, factors such as temperature, normal pH control range, and continuous aeration of the cooling water contribute to an environment that is ideal for microbial growth. The outcome of uncontrolled microbial and/or fungal growth on surfaces is a biofilm formation. Biofilms ("slime") typically are aggregates of biological and nonbiological materials. Biofilms can accelerate ongoing corrosion processes, have bi-products that can be directly aggressive to metals of cooling circles, decrease heat transfer efficiency and reduce cooling water flow.

Turning now to an overview of the aspects of the invention, one or more embodiments of the invention address one or more of the above-described shortcomings of the prior art by providing a deionized-water cooling system for an electrical equipment that protects copper and stainless steel components of the cooling system from corrosion and bacterial and fungi build up.

FIG. 1 illustrates a liquid cooling system 100 for electrical equipment, for example, datacom equipment, that shows a datacom equipment cooling system (DECS) loop 101, an in-rack cooling distribution unit (CDU) 110 and an external CDU 120 in accordance with one or more embodiments of the present invention. A deionized-water cooling system 150 can be connected to either the in-rack CDU 110 and/or the external CDU 120. The liquid cooling system 100 can include a chiller 115, which can contain a refrigerant or a like system for a refrigeration cycle, to be linked to a direct cooling tower 130 through a condenser water system 140. The direct cooling tower 130 cools the water that is then returned into the liquid cooling system 100 via a return loop of the condenser water system 140.

Figure 2:
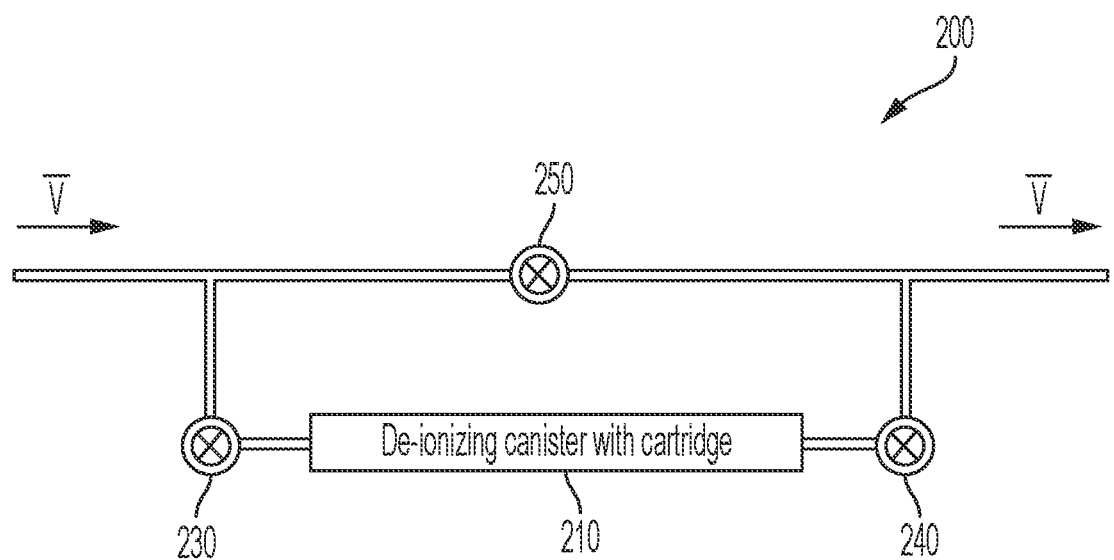
FIG. 2 depicts a deionizing bypass according to embodiments of the present invention.

FIG. 2 illustrates a contemporary deionizing bypass 200 in accordance with one or more embodiments of the present invention. The deionizing bypass 200 can be included in the deionized-water cooling system 150 to deionize the water circulating in the liquid cooling system 100 (shown in FIG. 1). The deionizing bypass 200 shown in FIG. 2 includes a deionizing canister 210 having a cartridge for deionizing the water that passes though the deionizing canister 210. The deionizing bypass 200 shown in FIG. 2 also includes valves 230, 240. During normal operation of the deionizing bypass 200, valves 230, 240 are closed and a valve 250 is fully open. Accordingly, the water flows in a "V" direction shown in FIG. 2. When the water needs to be deionized, the valves 230, 240 can be opened and the valve 250 can be partially closed to bypass some of the water through the deionizing canister 210. During this deionization, the liquid cooling system 100 operates under normal conditions. When the deionization is completed, the valves 230, 240 are closed and the valve 250 is fully opened.

Figure 3:
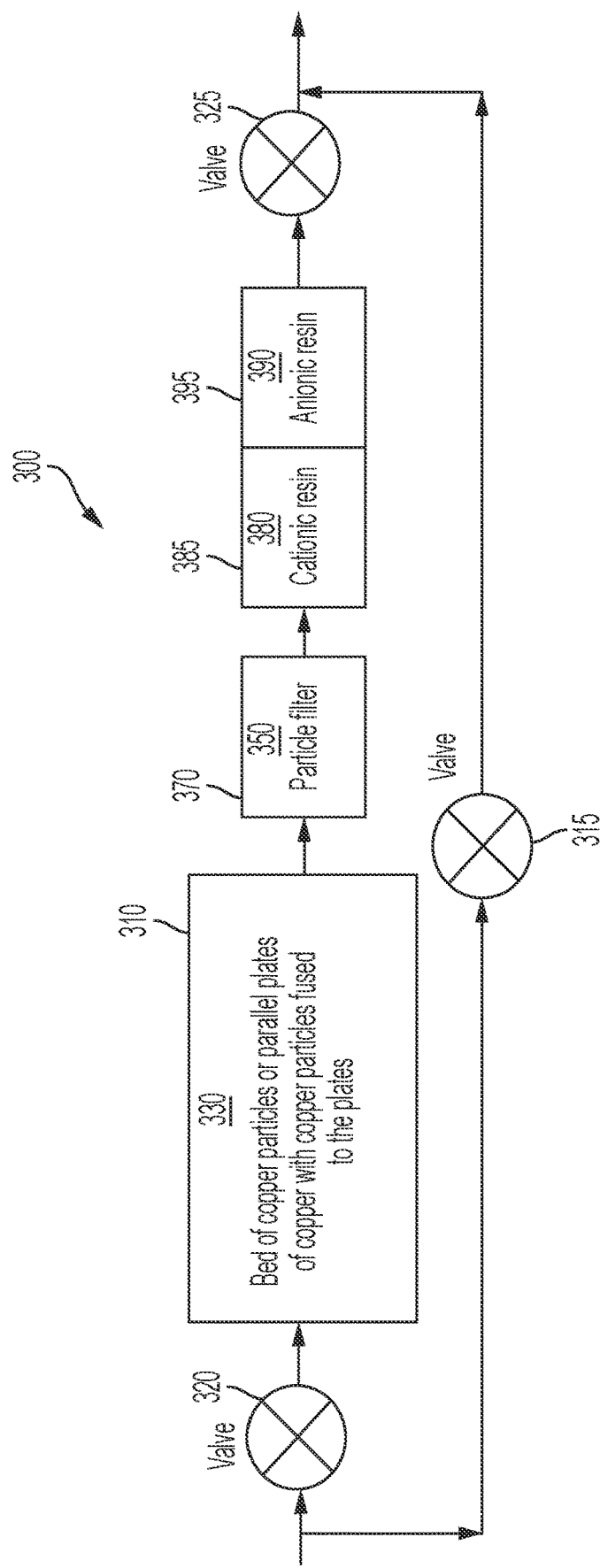
FIG. 3 depicts a deionized (DI)-water cooling system according to embodiments of the present invention.

FIG. 3 illustrates a deionized (DI)-water cooling system 300 according to one or more embodiments of the present invention. The DI water cooling system 300 shown in FIG. 3 includes a first filter housing 310. The first filter housing 310 has a first cartridge 330 that can include copper particles for removal of dissolved oxygen from the water that passes through the first cartridge 330. The copper particles in the first cartridge 330 can be arranged as a bed of copper particles. The copper particles can have a diameter range from about 20 µm to about 38 µm. Alternatively, the first cartridge 330 can include stacked in parallel sheets of copper on which micro balls of copper are fused. Any other arrangement of copper particles can be used to allow copper to react with and remove dissolved oxygen. In addition, silver particles can be used alone or in combination with copper particles.

As illustrated in FIG. 3, the DI-water cooling system 300 can also include a particle filter 350 within a particle filter housing 370. The particle filter 350 can include a perforated sheet (not shown) to catch and remove any byproduct of copper corrosion that flakes off the copper particles of the first cartridge 330. In addition, the particle filter 350 can include metal oxide suspension to remove acids from the DI water and provide a source of metal ions. Each filter housing 310 and particle filter housing 370 can be about 12 inches (in) in length and have about 3 in diameters.

In addition, a reservoir (not shown) can be provided with the DI-water cooling system 300 that allows for a degasification reaction for removal of dissolved oxygen and carbon dioxide from the DI water, for example, using nitrogen to "bubble" the DI water thereby pulling out dissolved oxygen and carbon dioxide. Nitrogen can subsequently be removed from the DI water by, for example, a pull vacuum. A nitrogen "blanket" can be formed on the reservoir as a result of the reaction thereby preventing additional oxygen reentering the DI-water cooling system 300.

Further, as shown in FIG. 3, the DI-water cooling system 300 can include a cationic resin 380 within a cationic resin housing 385, and anionic resin 390 within an anionic resin housing 395 for deionization of water passing through the DI-water cooling system 300. Cation and anion resins 380, 390 can be small, porous, plastic beads (not shown), for example, having 0.5 mm diameter, that are fixed with a specific charge. This fixed charge cannot be removed and is part of the resins' crosslinked structure. Each resin bead also contains a neutralizing counterion that is able to move in and out of the bead, which is replaced with an ion of similar charge during the process of ion exchange (when an aqueous solution is passed through the beads and the ion exchange occurs, removing the undesirable contaminant, i.e., deionization process).

As shown in FIG. 3, the DI-water cooling system 300 can also include first and second shut off valves 320, 325, on a first and second side of the DI-water cooling system 300, respectively. The first and second shut off valves 320, 325 can be engaged to shut off the flow of water to the DI-water cooling system 300 to allow for first cartridge 330 and the particle filter 350 replacement. A third shut off valve 315 can be provided to allow for bypass of the water flow. During normal operation of the DI-water cooling system 300, shut off valves 320, 325 are closed and the valve 315 is opened. Accordingly, the water flows in a direction shown in FIG. 3. When the water needs to be treated according to embodiments of the present invention, the shut off valves 320, 325 can be opened and the valve 315 can be either partially closed to bypass some of the water through the first cartridge 330, the particle filter 350 and cation and anion resins 380, 390 or fully closed. When the treatment of the system according to embodiments of the invention is completed, the shut off valves 320, 325 are closed and the valve 315 is fully opened.

Figure 4:
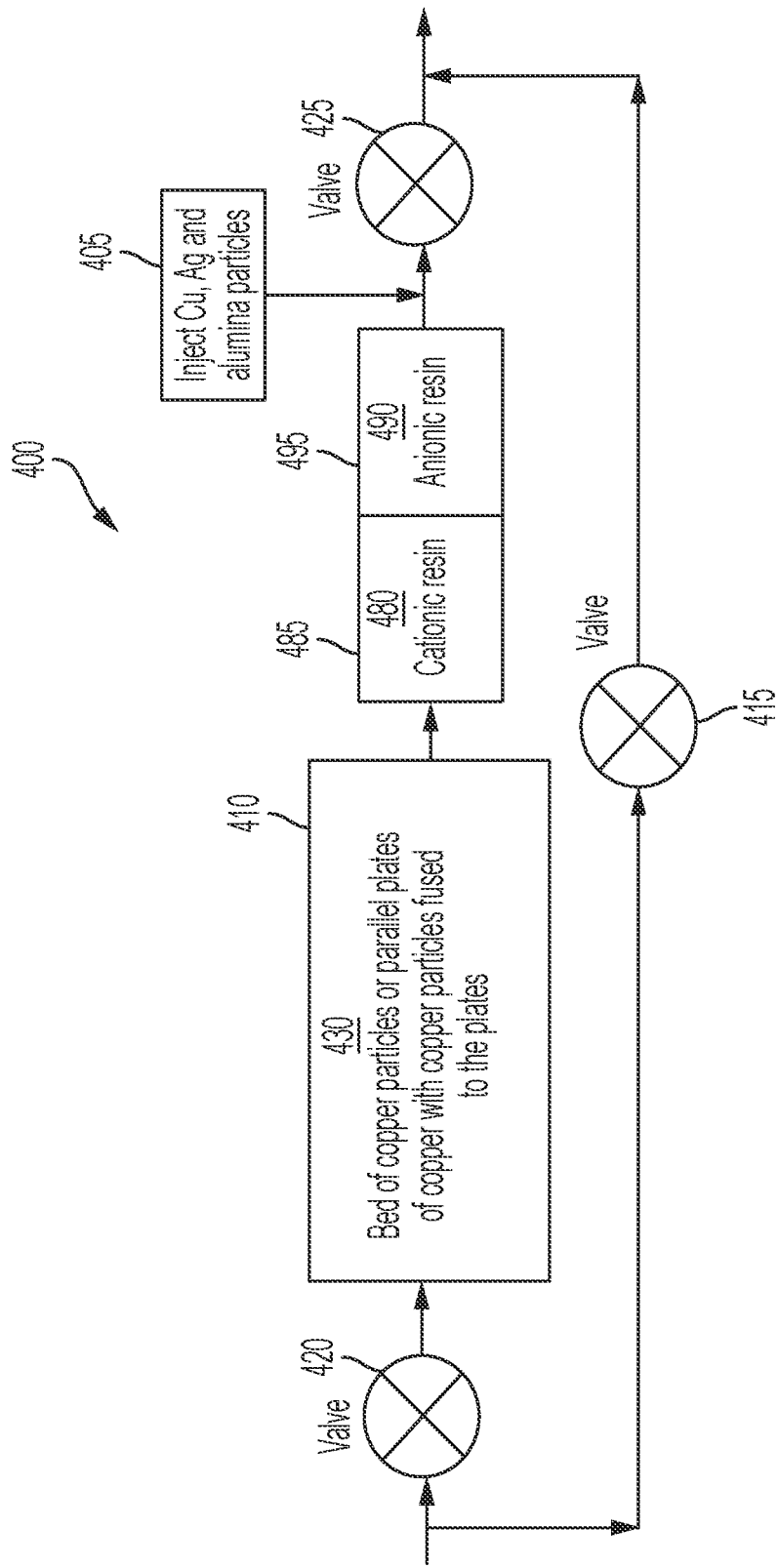
FIG. 4 depicts a DI-water cooling system where metal particles remain suspended in DI water according to embodiments of the present invention.

FIG. 4 illustrates another embodiment of the present invention, where a DI-water cooling system 400 allows for metal particles (not shown) to remain suspended in DI water used in the DI-water cooling system 400 in accordance with one or more embodiments of the present invention. The DI-water cooling system 400 shown in FIG. 4 includes a first filter housing 410. The first filter housing 410 has a first cartridge 430 that can include copper particles for removal of dissolved oxygen from the water that passes through the first cartridge 430. The copper particles in the first cartridge 430 can be arranged as a bed of copper particles in the range from about 20 µm to about 38 µm. Alternatively, the first cartridge 430 can include stacked in parallel sheets of copper on which micro balls of copper are fused. Any other arrangement of copper particles can be used to allow copper to react with and remove dissolved oxygen. In addition, silver particles can be used alone or in combination with copper particles.

As shown in FIG. 4, the DI-water cooling system 400 includes a cationic resin 480 within a cationic resin housing 485, and anionic resin 490 within an anionic resin housing 495 to continuedly deionize the water used in the DI-water cooling system 400. The DI-water cooling system 400 can further include an injection pump 405 for introducing into the DI-water cooling system 400 metal particles (not shown), for example, copper, alumina oxide ($Al_2O_3$) and/or silver particles in a diameter range from about 20 µm to about 38 µm.

According to one or more embodiments of the present invention, the DI-water cooling system 400 does not use a particle filter before the deionization process in order not to filter out the metal particles. Having the metal particles being suspended in the DI water increases surface area that is available to act as a biocide and abrade the inner surfaces of the cooling loop, especially the cold plate channels, so that bacteria does not settle on these surfaces because of mechanical erosion by the metal particles. Sub-micron ceramic particles, such as, for example, alumina will be in emulsion in the DI water and not be trapped by the deionizing resins 480, 490. The particles would abrade the metal surfaces and not allow bacteria from settling on the inner surfaces of the cooling loop, especially the cold plate channels.

As shown in FIG. 4, the DI-water cooling system 400 can also include first and second shut off valves 420, 425, on a first and second side of the DI-water cooling system 400, respectively. The first and second shut off valves 420, 425 can be engaged to shut off the flow of water to the DI-water cooling system 400 to allow for the first cartridge 430 replacement. A third shut off valve 415 can be provided to allow for bypass of the water flow. During normal operation of the DI-water cooling system 400, shut off valves 425, 425 are closed and the valve 415 is fully open. Accordingly, the water flows in a direction shown in FIG. 4. When the water needs to be treated according to embodiments of the present invention, the shut off valves 420, 425 can be opened and the valve 415 can be either partially closed to bypass some of the water through the first cartridge 430 and cation and anion resins 480, 490 or fully closed. When the treatment of the system according to embodiments of the invention is completed, the shut off valves 420, 425 are closed and the valve 415 is fully opened.

Further, according to embodiments of the present invention, the DI-water cooling systems 400, 300 can include continually exposing the systems to ultraviolet (UV) light by a conventional UV light system (not shown) to reduce bacteria throughout the life of the systems.

Figure 5:
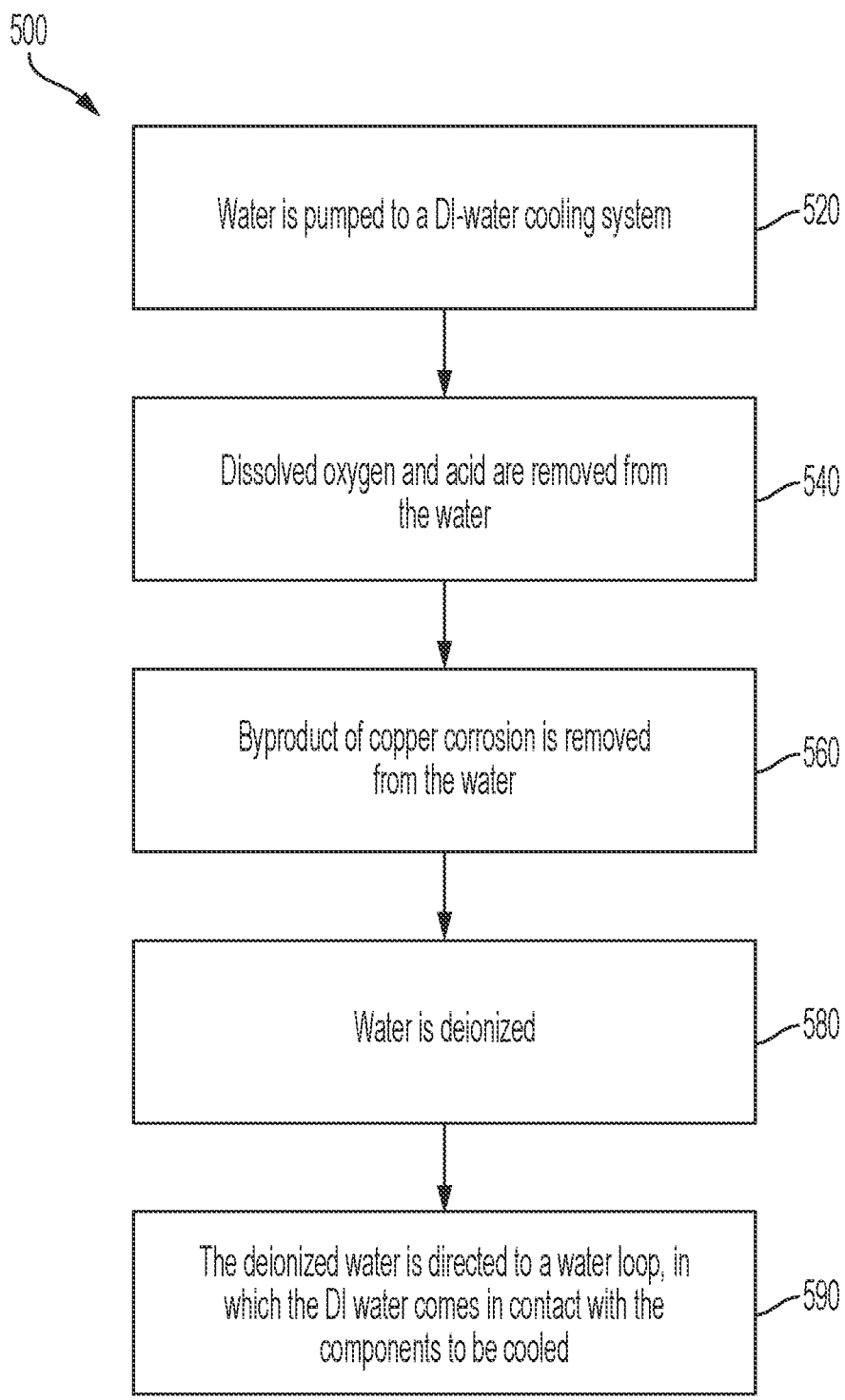
FIG. 5 depicts a flow diagram of a method for DI-water cooling of the electrical equipment according to embodiments of the present invention.

FIG. 5 is a flow diagram illustrating a method 500 for DI-water cooling of the electrical equipment, for example, datacom equipment in accordance with one or more embodiments of the present invention. Each block described below can be implemented by a controller (not shown) having computer readable program instructions for causing a processor to carry out aspects of the method 500.

At block 520, a liquid, such as water from a facility's waste system, is pumped to a DI-water cooling system via known propulsion method, for example, a pump (not shown).

At block 540, dissolved oxygen and acid are removed from the water via a first cartridge 330 that can include copper particles, silver particles or the like, arranged as a bed of particles having a diameter range from about 20 µm to about 38 µm.

At block 560, a byproduct of copper corrosion is removed via the particle filter 350 (shown in FIG. 3) provided within the particle filter housing 370.

At block 580, the passing water is deionized via the cationic resin 380 and the anionic resin 390.

At block 590, the deionized water is directed to a water loop, for example, the DECS loop 101, in which the DI water comes in contact with the components to be cooled.

Figure 6:
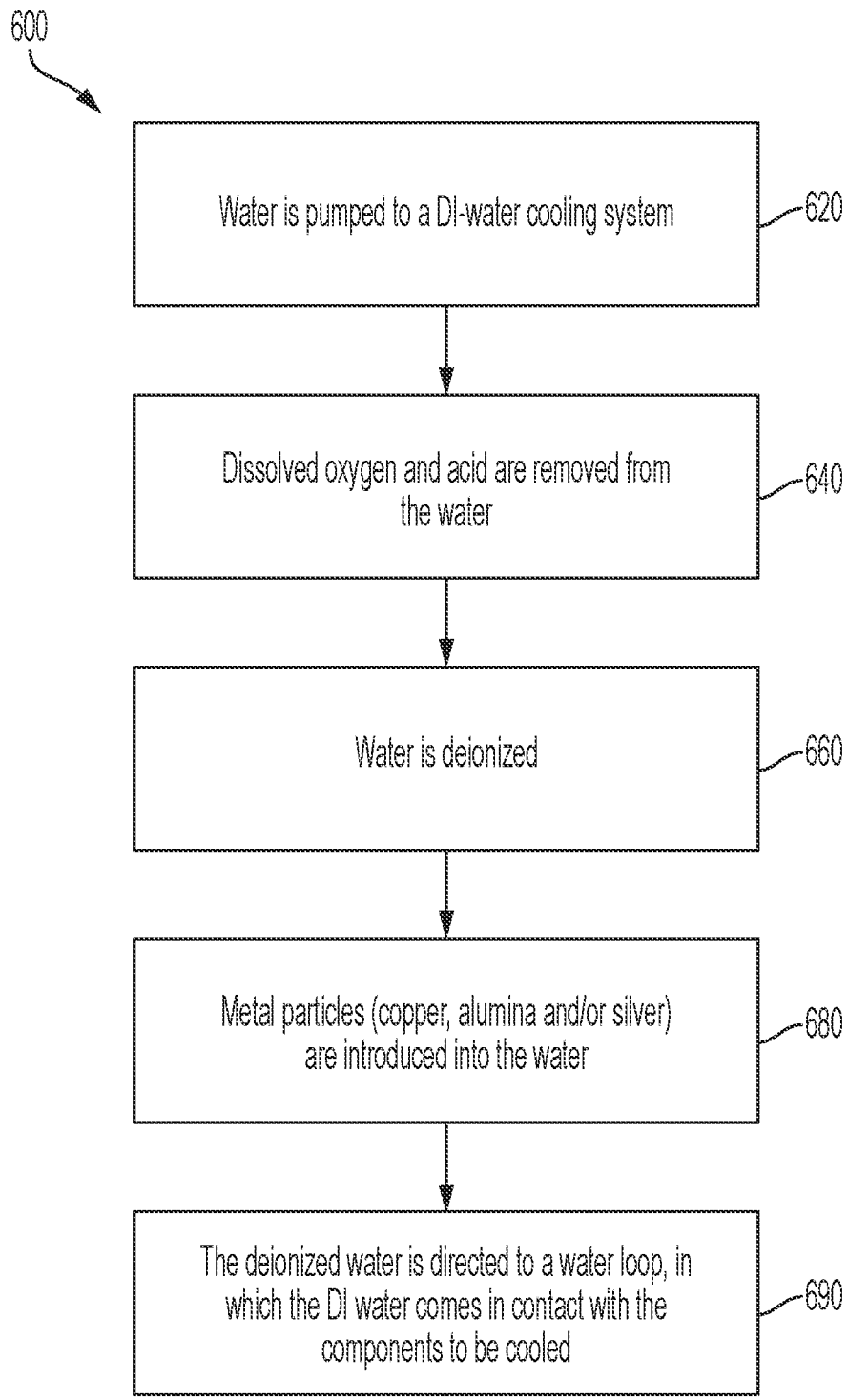
FIG. 6 depicts a flow diagram of another method for DI-water cooling of the electrical equipment according to embodiments of the present invention.

FIG. 6 is a flow diagram illustrating a method 600 for DI-water cooling of the electrical equipment, for example, datacom equipment in accordance with one or more embodiments of the present invention. Each block described below can be implemented by a controller (not shown) having computer readable program instructions for causing a processor to carry out aspects of the method 600.

At block 620, a liquid, such as water from a facility's waste system, is pumped to a DI-water cooling system 400 via known propulsion method, for example, a pump (not shown).

At block 640, dissolved oxygen and acid are removed from the water via a first cartridge 430 that can include copper particles, silver particles or the like, arranged as a bed of particles having a diameter range from about 20 µm to about 38 µm.

At block 660, the passing water is deionized via the cationic resin 480 and the anionic resin 490.

At block 680, the water is introduced via, for example, the injection pump 405 (shown in FIG. 4) metal particles (not shown), for example, copper, alumina and/or silver particles in a diameter range from about 20 µm to about 38 µm to act as biocides and abrade the inner surfaces of the cooling loop, especially the cold plate channels so that bacteria does not settle on these surfaces because of mechanical erosion by the metal particles. Sub-micron ceramic particles, such as, for example, alumina will be in emulsion in the DI water and not be trapped by the deionizing resins 480, 490. The particles would abrade the metal surfaces and not allow bacteria from settling on the inner surfaces of the cooling loop, especially the cold plate channels.

At block 690, the deionized water is directed to a water loop, for example, the DECS loop 101, in which the DI water comes in contact with the components to be cooled.

Various embodiments of the invention are described herein with reference to the related drawings. Alternative embodiments of the invention can be devised without departing from the scope of this invention. Various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. Moreover, the various tasks and process steps described herein can be incorporated into a more comprehensive procedure or process having additional steps or functionality not described in detail herein.

Many of the functional units described in this specification can be labeled as modules. Embodiments of the invention apply to a wide variety of module implementations. For example, a module can be implemented as a hardware circuit including custom VLSI circuits or gate arrays, off-the-shelf semiconductors such as logic chips, transistors, or other discrete components. A module can also be implemented in programmable hardware devices such as field programmable gate arrays, programmable array logic, programmable logic devices or the like. Modules can also be implemented in software for execution by various types of processors. An identified module of executable code can, for instance, include one or more physical or logical blocks of computer instructions which can, for instance, be organized as an object, procedure, or function. Nevertheless, the executables of an identified module need not be physically located together, but can include disparate instructions stored in different locations which, when joined logically together, include the module and achieve the stated purpose for the module.

In some embodiments, various functions or acts can take place at a given location and/or in connection with the operation of one or more apparatuses or systems. In some embodiments, a portion of a given function or act can be performed at a first device or location, and the remainder of the function or act can be performed at one or more additional devices or locations.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The present disclosure has been presented for purposes of illustration and description, but is not intended to be exhaustive or limited to the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

The diagrams depicted herein are illustrative. There can be many variations to the diagram or the steps (or operations) described therein without departing from the spirit of the disclosure. For instance, the actions can be performed in a differing order or actions can be added, deleted or modified. Also, the term "coupled" describes having a signal path between two elements and does not imply a direct connection between the elements with no intervening elements/connections therebetween. All of these variations are considered a part of the present disclosure.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include both an indirect "connection" and a direct "connection."

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instruction by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A deionized (DI)-water cooling system comprising:
a cooling loop comprising water, wherein the cooling loop contacts electrical equipment; and
a deionization bypass connected to the cooling loop, the deionization bypass comprising:
a first filter component comprising a plurality of copper sheets stacked in parallel and a plurality of copper balls fused to surfaces of the plurality of copper sheets,
wherein the copper balls remove dissolved oxygen from the water in the cooling loop;
a deionization cartridge comprising a cationic resin and an anionic resin,
wherein the cationic resin comprises a crosslinked structure having a fixed positive charge and the anionic resin comprises a crosslinked structure having a fixed negative charge, and
wherein the deionization cartridge deionizes the water in the cooling loop, the deionization cartridge positioned downstream of the first filter component; and
an injection pump coupled to a supply of metal particles, the injection pump configured to pump the metal particles into to the deionization bypass after the deionization cartridge; and
a plurality of valves that can be placed into a first configuration and a second configuration,
wherein placing the valves in the first configuration forces a portion of the water in the cooling loop to enter the deionization bypass, and
wherein placing the valves in the second configuration allows all of the water in the cooling loop to bypass the deionization bypass.

2. The system of claim 1, wherein the metal particles are comprised of copper, alumina oxide ($Al_2O_3$) or silver particles.

3. The system of claim 2, wherein the metal particles have a diameter range from about 20 µm to about 38 µm.

4. The system of claim 1, wherein the deionization bypass further comprises an ultraviolet (UV) light system configured to eliminate bacteria.

5. The system of claim 1, wherein the deionization bypass further comprises a reservoir configured for a degasification reaction for removal of dissolved oxygen and carbon dioxide from the deionization bypass.

* * * * *